US011449651B2

(12) United States Patent
Ostrowski et al.

(10) Patent No.: US 11,449,651 B2
(45) Date of Patent: Sep. 20, 2022

(54) ENHANCED COMPONENT DIMENSIONING

(71) Applicant: Ford Global Technologies, LLC, Dearborn, MI (US)

(72) Inventors: David Ostrowski, Northville, MI (US); Christopher Leon Jones, Detroit, MI (US); Jacob Martin Povirk, Franklin, MI (US); Andrew Christipher Posa, Plymouth, MI (US); Charles Krysztof, Canton, MI (US); Antonio Stranges, Livonia, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 434 days.

(21) Appl. No.: 16/674,645

(22) Filed: Nov. 5, 2019

(65) Prior Publication Data
US 2021/0133292 A1 May 6, 2021

(51) Int. Cl.
*G06F 30/20* (2020.01)
*G06N 20/00* (2019.01)
(Continued)

(52) U.S. Cl.
CPC ............... *G06F 30/20* (2020.01); *G06N 5/04* (2013.01); *G06N 20/00* (2019.01); *G05D 1/0088* (2013.01); *G07C 5/085* (2013.01)

(58) Field of Classification Search
None
See application file for complete search history.

(56) References Cited

U.S. PATENT DOCUMENTS

| 6,609,051 B2 | 8/2003 | Fiechter et al. |
| 8,024,158 B2 | 9/2011 | Uchida et al. |

(Continued)

FOREIGN PATENT DOCUMENTS

| CN | 103425844 A | 12/2013 |
| CN | 104077434 A | 10/2014 |

(Continued)

OTHER PUBLICATIONS

Kadhim, "Effective strain damage model associated with finite element modelling and experimental validation", 2012, International Journal of Fatigue (Year: 2012).*

(Continued)

*Primary Examiner* — Hossain M Morshed
(74) *Attorney, Agent, or Firm* — Brandon Hicks; Bejin Bieneman PLC

(57) ABSTRACT

A computer includes a processor and a memory storing instructions executable by the processor to generate an operation parameter histogram for each of a plurality of vehicle operation parameters, operate a test vehicle according to the operation parameter histograms, input each operation parameter histogram and a plurality of test vehicle environment data to a machine learning program, output from the machine learning program a classification for each operation parameter histogram from the machine learning program, input the classifications to a predictive damage model of a three-dimensional schematic of a vehicle component, and adjust one of a size or a shape of the three-dimensional schematic based the output of the predictive damage model. The operation parameter histograms are based on collected data about operation of a plurality of vehicles. Each operation parameter histogram includes an array of elements. Each element is a number of data points for one of the operation parameters that are within a speci- (Continued)

fied range. Each classification represents a type of environment and a type of test vehicle use.

20 Claims, 6 Drawing Sheets

(51) Int. Cl.
  *G06N 5/04* (2006.01)
  *G05D 1/00* (2006.01)
  *G07C 5/08* (2006.01)

(56) References Cited

U.S. PATENT DOCUMENTS

| | | | | |
|---|---|---|---|---|
| 8,849,803 | B2* | 9/2014 | Grabau | G06Q 40/08 |
| | | | | 707/722 |
| 9,558,600 | B2 | 1/2017 | Rice et al. | |
| 2004/0122618 | A1 | 6/2004 | Suzuki et al. | |
| 2009/0248368 | A1 | 10/2009 | Goel | |
| 2009/0319453 | A1 | 12/2009 | Goel | |
| 2011/0040542 | A1 | 2/2011 | Sendhoff et al. | |
| 2013/0157599 | A1* | 6/2013 | Ray | H04B 1/16 |
| | | | | 455/130 |
| 2016/0005422 | A1* | 1/2016 | Zad Issa | H03G 3/32 |
| | | | | 704/226 |
| 2016/0035155 | A1 | 2/2016 | Rice et al. | |
| 2018/0232964 | A1 | 8/2018 | Chen et al. | |
| 2019/0315237 | A1* | 10/2019 | Trnka | B60L 3/12 |

FOREIGN PATENT DOCUMENTS

| | | |
|---|---|---|
| CN | 104123401 A | 10/2014 |
| WO | 2004095320 A1 | 11/2004 |
| WO | 2018201142 A1 | 11/2018 |

OTHER PUBLICATIONS

Kagnici, "Vibration Induced Fatigue Assessment in Vehicle Development Process", 2012, Vibration Induced Fatigue Assessment in Vehicle Development Process (Year: 2012).*

Fatih Kagnici, "Vibration Induced Fatigue Assessment in Vehicle Development Process", Open Science Index, Mechanical and Mechatronics Engineering vol. 6, No. 4, 2012 waset.org/Publication/7687.

* cited by examiner

Class A

Class B

Class C

Class D

Class E

Class F

ENHANCED COMPONENT DIMENSIONING

BACKGROUND

Vehicles include a plurality of individual components. The components are each specified to have specific tolerances and for specific operation of the vehicle. For example, a steering gear transmits rotation of a steering column to translation of a steering rack. Rotation of the steering gear induces stresses to the steering gear. Components are typically designed to absorb stresses during operation.

DETAILED DESCRIPTION

Figure 1:
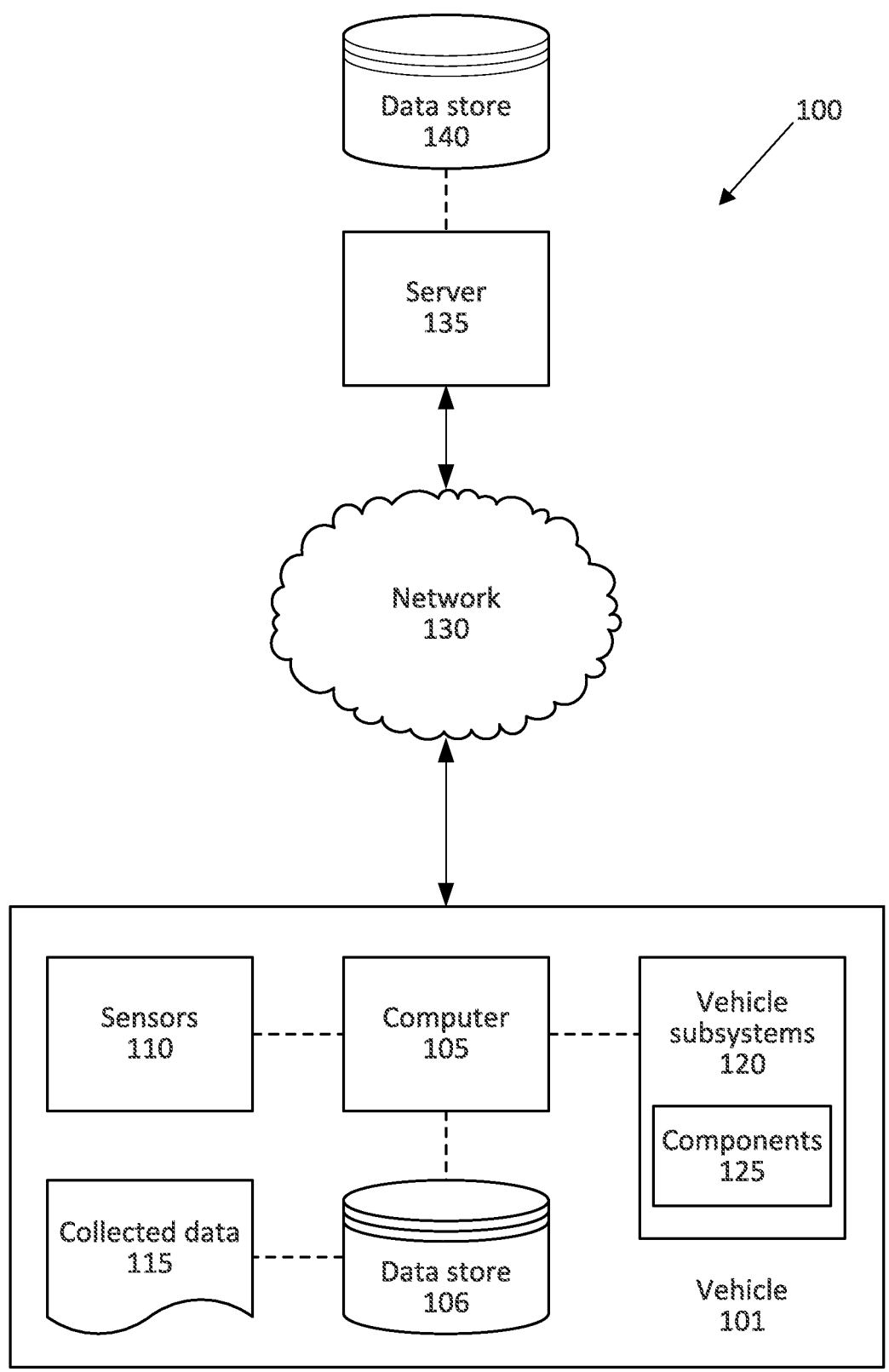
FIG. 1 is a block diagram of an example system for collecting test vehicle operation data.

A computer includes a processor and a memory, the memory storing instructions executable by the processor to generate an operation parameter histogram for each of a plurality of vehicle operation parameters based on collected data about operation of a plurality of vehicles, each operation parameter histogram including an array of elements, each element being a number of data points for one of the operation parameters that are within a specified range, operate a test vehicle according to the operation parameter histograms, input each operation parameter histogram and a plurality of test vehicle environment data to a machine learning program, output from the machine learning program a classification for each operation parameter histogram from the machine learning program, each classification representing a type of environment and a type of test vehicle use, input the classifications to a predictive damage model of a three-dimensional schematic of a vehicle component, and adjust one of a size or a shape of the three-dimensional schematic based the output of the predictive damage model.

The instructions can further include instructions to, upon adjusting one of the size or the shape of the three-dimensional schematic, input the classifications to a predictive damage model of the adjusted three-dimensional schematic and adjust one of a size or a shape of the adjusted three-dimensional schematic based on the output of the predictive damage model.

The instructions can further include instructions to input the classifications and successive adjusted three-dimensional schematics to successive predictive damage models until an optimization criterion for at least one of the size or the shape of the three-dimensional schematic is satisfied.

The instructions can further include instructions to adjust a material thickness of the three-dimensional schematic based on the output of the predictive damage model.

The output of the predictive damage model can include a fatigue limit specifying a stress on a virtual component modeled according to the three-dimensional schematic that generates a strain exceeding a material yield strength.

The fatigue limit can be a number of revolutions of the virtual component rotating at a specified torque.

The instructions can further include instructions to input performance data from a vehicle dynamics model to a predictive damage model for a virtual component constructed according to the three-dimensional schematic.

The vehicle dynamics model can include a model of a plurality of road segments and the performance data for the virtual component includes performance data for each road segment.

The vehicle dynamics model can include a model of a plurality of road conditions, and the performance data includes data of the virtual component operating in the plurality of road conditions.

Each road condition can be associated with one of the classifications.

The type of test vehicle use can include at least one of a specified speed limit, a stop light, or a traffic intersection.

The operation parameters can include at least one of a vehicle speed, a steering torque, a braking torque, a fuel flow rate, or a transmission speed.

The instructions can further include instructions to adjust the size of the three-dimensional schematic to reduce a weight of a vehicle component constructed according to the three-dimensional schematic.

The type of environment can include at least one of a rural environment, an urban environment, and a highway environment.

A method includes generating an operation parameter histogram for each of a plurality of vehicle operation parameters based on collected data about operation of a plurality of vehicles, each operation parameter histogram including an array of elements, each element being a number of data points for one of the operation parameters that are within a specified range, operating a test vehicle according to the operation parameter histograms, input each operation parameter histogram and a plurality of test vehicle environment data to a machine learning program, outputting from the machine learning program a classification for each operation parameter histogram from the machine learning program, each classification representing a type of environment and a type of test vehicle use, inputting the classifications to a predictive damage model of a three-dimensional schematic of a vehicle component, and adjusting one of a size or a shape of the three-dimensional schematic based the output of the predictive damage model.

The method can further include, upon adjusting one of the size or the shape of the three-dimensional schematic, inputting the classifications to a predictive damage model of the adjusted three-dimensional schematic and adjusting one of a size or a shape of the adjusted three-dimensional schematic based on the output of the predictive damage model.

The method can further include inputting the classifications and successive adjusted three-dimensional schematics to successive predictive damage models until an optimization criterion for at least one of the size or the shape of the three-dimensional schematic is satisfied.

The method can further include adjusting a material thickness of the three-dimensional schematic based on the output of the predictive damage model.

The output of the predictive damage model can include a fatigue limit specifying a stress on a virtual component modeled according to the three-dimensional schematic that generates a strain exceeding a material yield strength.

The fatigue limit can be a number of revolutions of the virtual component rotating at a specified torque.

The method can further include inputting performance data from a vehicle dynamics model to a predictive damage model for a virtual component constructed according to the three-dimensional schematic.

The vehicle dynamics model can include a model of a plurality of road segments and the performance data for the virtual component includes performance data for each road segment.

The vehicle dynamics model can include a model of a plurality of road conditions, and the performance data includes data of the virtual component operating in the plurality of road conditions.

Each road condition can be associated with one of the classifications.

The type of test vehicle use can include at least one of a specified speed limit, a stop light, or a traffic intersection.

The operation parameters can include at least one of a vehicle speed, a steering torque, a braking torque, a fuel flow rate, or a transmission speed.

The method can further include adjusting the size of the three-dimensional schematic to reduce a weight of a vehicle component constructed according to the three-dimensional schematic.

The type of environment can include at least one of a rural environment, an urban environment, and a highway environment.

A system includes a test vehicle including a plurality of vehicle sensors, means for generating an operation parameter histogram for each of a plurality of vehicle operation parameters based on collected data about operation of a plurality of vehicles, each operation parameter histogram including an array of elements, each element being a number of data points for one of the operation parameters that are within a specified range, means for operating a test vehicle according to the operation parameter histograms, means for inputting each operation parameter histogram and a plurality of test vehicle environment data to a machine learning program, means for outputting from the machine learning program a classification for each operation parameter histogram from the machine learning program, each classification representing a type of environment and a type of test vehicle use, means for inputting the classifications to a predictive damage model of a three-dimensional schematic of a vehicle component, and means for adjusting one of a size or a shape of the three-dimensional schematic based the output of the predictive damage model.

The system can further include means for inputting the classifications to a predictive damage model of the adjusted three-dimensional schematic and adjusting one of a size or a shape of the adjusted three-dimensional schematic based on the output of the predictive damage model upon adjusting one of the size or the shape of the three-dimensional schematic.

The system can further include means for inputting performance data from a vehicle dynamics model to a predictive damage model for a virtual component constructed according to the three-dimensional schematic.

Further disclosed is a computing device programmed to execute any of the above method steps. Yet further disclosed is a vehicle comprising the computing device. Yet further disclosed is a computer program product, comprising a computer readable medium storing instructions executable by a computer processor, to execute any of the above method steps.

Collecting data about vehicle operation from a plurality of test vehicles according to predefined operation parameter histograms allows schematics of virtual components to be tested with actual vehicle operation and environmental data, improving specifications that can be provided for a component, i.e., size and/or shape can be better specified. That is, by adjusting schematics according to stresses and strains induced according to data, the component can be designed to meet one or more optimization criteria, e.g., cost, weight, fatigue limit, etc. Incorporating operation data and environmental data from a plurality of test vehicles to a predictive damage model for the schematic of a component provides a more accurate representation of the stresses that would be applied to the component during operation and allows the schematic to be adjusted to account for those stresses.

FIG. 1 illustrates an example system 100 for collecting data 115 about operation of a vehicle 101, i.e., "operation data." A computer 105 in the vehicle 101 is programmed to receive collected data 115 from one or more sensors 110. For example, vehicle 101 data 115 may include a location of the vehicle 101, data about an environment around a vehicle 101, data about an object outside the vehicle 101 such as another vehicle, etc. A vehicle 101 location is typically provided in a conventional form, e.g., geo-coordinates such as latitude and longitude coordinates obtained via a navigation system that uses the Global Positioning System (GPS). Further examples of data 115 can include measurements of vehicle 101 systems and components, e.g., a vehicle 101 velocity, a vehicle 101 trajectory, etc.

The computer 105 is generally programmed for communications on a vehicle 101 network, e.g., including a conventional vehicle 101 communications bus such as a CAN bus, LIN bus etc., and or other wired and/or wireless technologies, e.g., Ethernet, WIFI, etc. Via the network, bus, and/or other wired or wireless mechanisms (e.g., a wired or wireless local area network in the vehicle 101), the computer 105 may transmit messages to various devices in a vehicle 101 and/or receive messages from the various devices, e.g., controllers, actuators, sensors, etc., including sensors 110. Alternatively or additionally, in cases where the computer 105 actually comprises multiple devices, the vehicle network may be used for communications between devices represented as the computer 105 in this disclosure. In addition, the computer 105 may be programmed for communicating with the network 130, which, as described below, may include various wired and/or wireless networking technologies, e.g., cellular, Bluetooth®, Bluetooth® Low Energy (BLE), wired and/or wireless packet networks, etc.

The data store 106 can be of any type, e.g., hard disk drives, solid state drives, servers, or any volatile or non-volatile media. The data store 106 can store the collected data 115 sent from the sensors 110.

Sensors 110 can include a variety of devices. For example, various controllers in a vehicle 101 may operate as sensors 110 to provide data 115 via the vehicle 101 network or bus, e.g., data 115 relating to vehicle speed, acceleration, position, subsystem and/or component status, etc. Further, other sensors 110 could include cameras, motion detectors, etc., i.e., sensors 110 to provide data 115 for evaluating a position of a component, evaluating a slope of a roadway, etc. The sensors 110 could, without limitation, also include short range radar, long range radar, LIDAR, and/or ultrasonic transducers.

Collected data 115 can include a variety of data collected in a vehicle 101. Examples of collected data 115 are provided above, and moreover, data 115 are generally collected using one or more sensors 110, and may additionally include data calculated therefrom in the computer 105, and/or at the server 135. In general, collected data 115 may include any data that may be gathered by the sensors 110 and/or computed from such data. Operation data is a subset of data 115 of operation of the vehicle 101 that is collected about operation of one or more vehicle 101 subsystems 120 and/or components 125, operation data 115 including operation parameters of the vehicle 101. In this context, an "operation parameter" is a measurable quantity of operation of a vehicle component 125, as described below. Example operation parameters include, e.g., a vehicle speed, a steering torque, a braking torque, a fuel flow rate, a transmission speed, a temperature, fluid degradation, etc.

The vehicle 101 can include a plurality of vehicle subsystems 120. In this context, each vehicle subsystem 120 includes one or more hardware components 125 adapted to perform a mechanical function or operation—such as moving the vehicle 101, slowing or stopping the vehicle 101, steering the vehicle 101, etc. That is, each "component" 125 of the subsystem 120 is a physical part or a collection of physical parts, provided for some physical action, function, or operation, included in the subsystem 120. Non-limiting examples of subsystems 120 include a propulsion subsystem 120 (that includes, e.g., an internal combustion engine and/or an electric motor, etc., components 125 of which include pistons, motors, drive shafts, fuel injectors, etc.), a transmission subsystem 120, a steering subsystem 120 (components 125 of which may include one or more of a steering wheel, a steering rack, a steering gear, etc.), a brake subsystem 120 (components 125 of which may include a brake pad, a brake cable, a brake pump, a brake pedal, etc.), a park assist subsystem 120, an adaptive cruise control subsystem 120, an adaptive steering subsystem 120, a movable seat subsystem 120 (components 125 of which may include a track, a seat rail, a motor, etc.), and the like.

When the computer 105 operates the vehicle 101, the vehicle 101 is an "autonomous" vehicle 101. For purposes of this disclosure, the term "autonomous vehicle" is used to refer to a vehicle 101 operating in a fully autonomous mode. A fully autonomous mode is defined as one in which each of vehicle 101 propulsion (typically via a powertrain including an electric motor and/or internal combustion engine), braking, and steering are controlled by the computer 105. A semi-autonomous mode is one in which at least one of vehicle 101 propulsion (typically via a powertrain including an electric motor and/or internal combustion engine), braking, and steering are controlled at least partly by the computer 105 as opposed to a human operator. In a non-autonomous mode, i.e., a manual mode, the vehicle 101 propulsion, braking, and steering are controlled by the human operator.

The system 100 can further include a network 130 connected to a server 135 and a data store 140. The computer 105 can further be programmed to communicate with one or more remote sites such as the server 135, via the network 130, such remote site possibly including a data store 140. The network 130 represents one or more mechanisms by which a vehicle computer 105 may communicate with a remote server 135. Accordingly, the network 130 can be one or more of various wired or wireless communication mechanisms, including any desired combination of wired (e.g., cable and fiber) and/or wireless (e.g., cellular, wireless, satellite, microwave, and radio frequency) communication mechanisms and any desired network topology (or topologies when multiple communication mechanisms are utilized). Exemplary communication networks include wireless communication networks (e.g., using Bluetooth®, Bluetooth® Low Energy (BLE), IEEE 802.11, vehicle-to-vehicle (V2V) such as Dedicated Short Range Communications (DSRC), etc.), local area networks (LAN) and/or wide area networks (WAN), including the Internet, providing data communication services.

Figure 2:
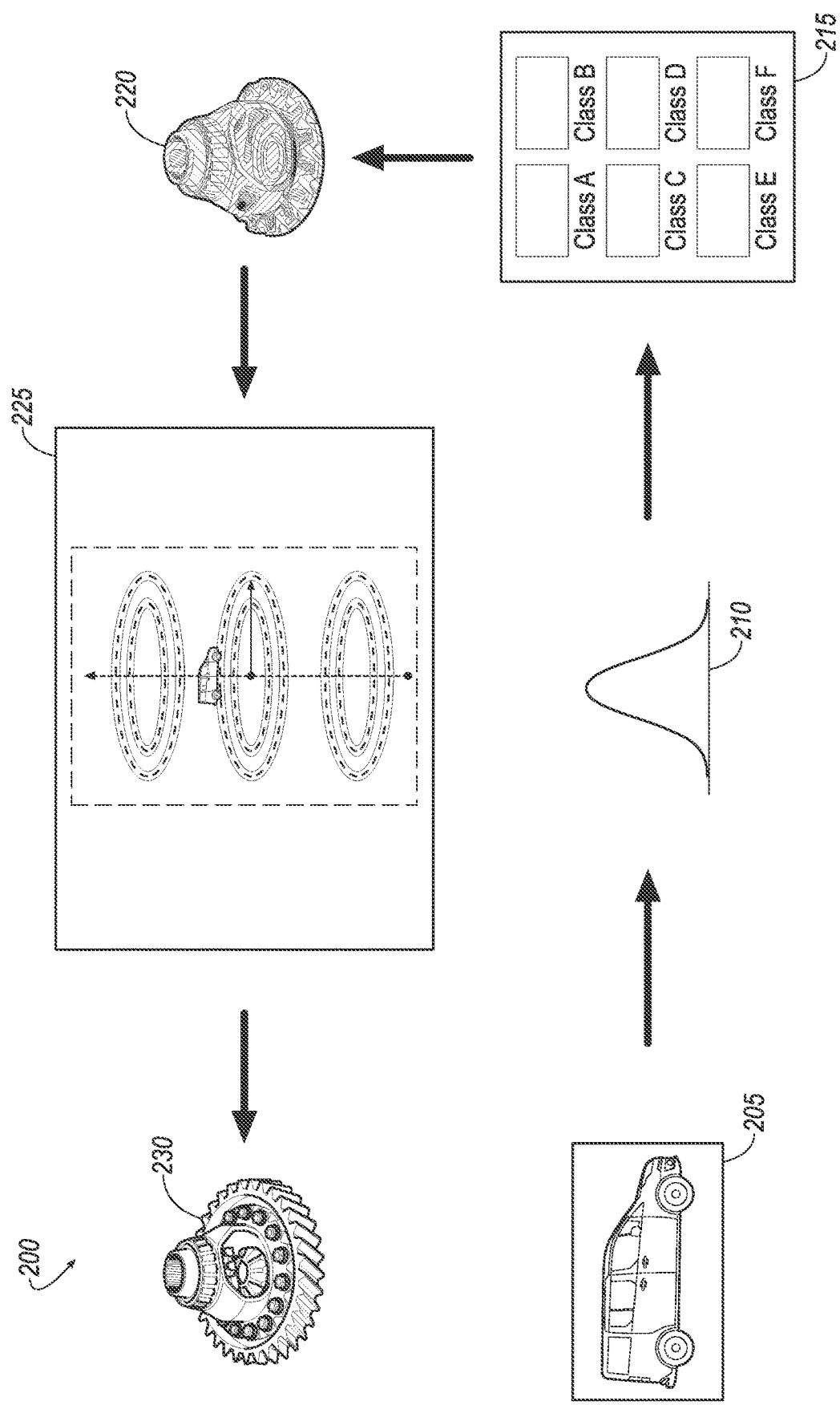
FIG. 2 is a block diagram illustrating an example process for designing a vehicle component.
Figure 3:
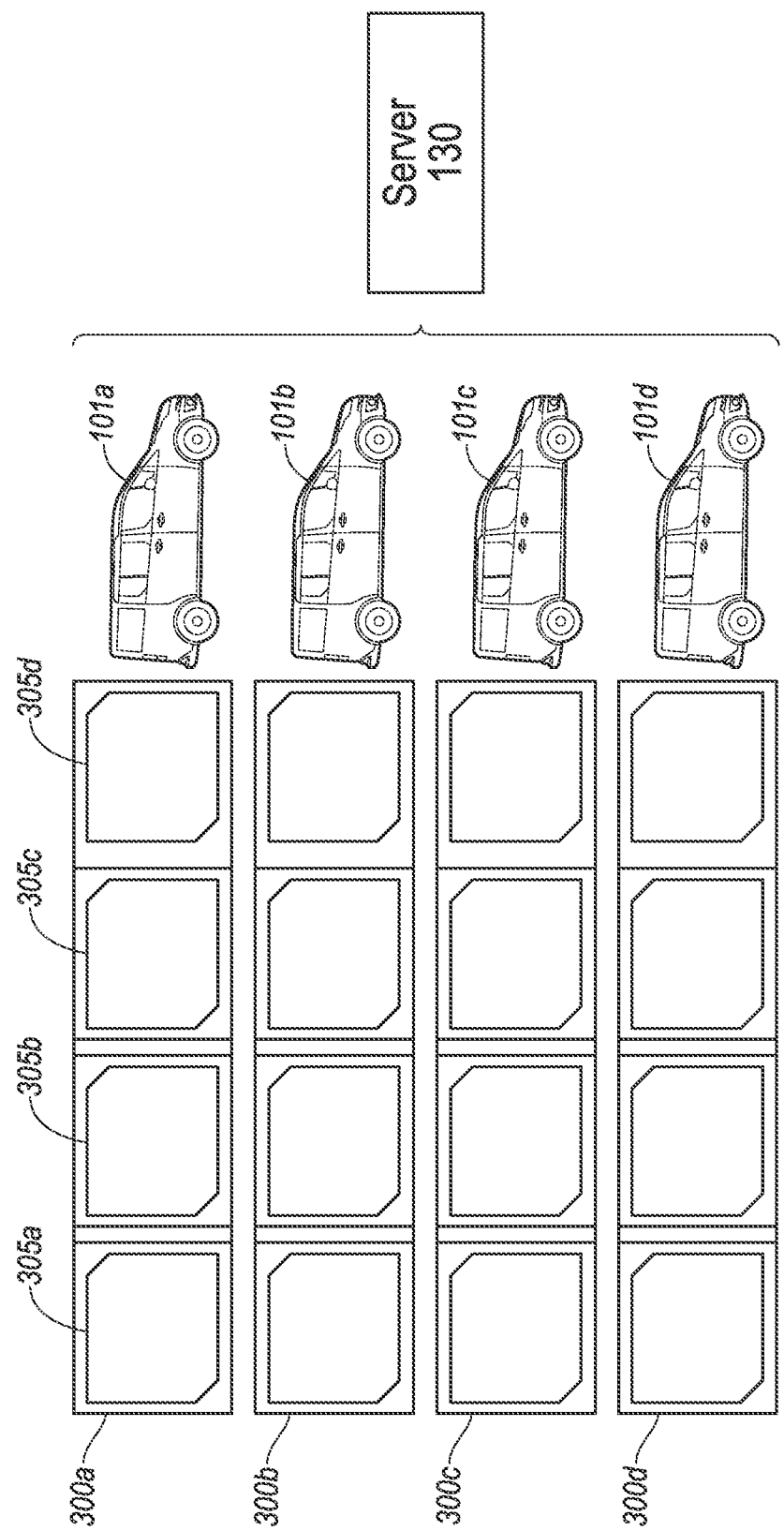
FIG. 3 is a block diagram of example operation parameter histograms for a test vehicle.

FIG. 2 is a block diagram illustrating a process 200 for determining specifications of a component 125 for a vehicle 101 subsystem 120. The process 200 is performed by a server 135 and a component manufacturer. The steps in FIG. 2 are exemplary and additional steps can be performed by the server 135 to design the component 125. In a first step 205, the server 135 transmits operation parameter histograms for a plurality of vehicle operation parameters to a plurality test vehicles 101. The operation parameter histograms, as described below and illustrated in FIG. 3, are arrays of elements that separate collected data 115 of operation parameters into predetermined ranges of a specific unit. For example, operation parameter histograms of data 115 for steering torque include predetermined ranges of torques in Newton-meters (N-m). The test vehicles 101 collect data 115 according to the operation parameter histograms, as illustrated in FIG. 3, discussed below.

In a second step 210, the server 135 collects the data 115 from the test vehicles 101 stored according to the operation parameter histograms. Each operation parameter histogram includes data describing vehicle operation parameters in a histogram format. That is, each operation parameter histogram includes a plurality of elements, each element including a number indicating a number of data points within a predetermined range of a measurable quantity, e.g., steering torque in ranges of N-m.

In a third step 215, the server 135 inputs the operation parameter histograms to a statistical analysis algorithm (e.g., a machine learning program) that outputs a classification for each operation parameter histogram, each classification representing a type of environment and a type of test vehicle use, as described below and shown in FIG. 4. Operating the component 125 in a specific classification can cause specific stresses according to conditions specified by the classification and a vehicle's operation of the component 125 to accommodate the conditions. The server 135 can use data 115 associated with each operation parameter histogram's classification to simulate different operation of the component 125 with a predictive damage model.

In a fourth step 220, the server 135 generates a three-dimensional schematic for the component 125, as described below and shown in FIG. 5. The schematic is a three-dimensional drawing that describe the three-dimensional shape and construction of the component 125, e.g., an engineering drawing such as a computer-aided design (CAD) drawing and/or a computer-aided engineering (CAE) model. The server 135 can input the schematic to a predictive damage model to predict material fatigue on a virtual component constructed according to the schematic. The server 135 can adjust dimensions of the schematic according to one or more optimization criteria, e.g., weight, cost, yield strength, fatigue limit, etc.

In a fifth step 225, upon satisfying the optimization criteria, the server 135 inputs performance data from a vehicle dynamics model that simulates operation of a virtual component 125 constructed according to the optimized schematic in a virtual vehicle 101 into the predictive damage model. The vehicle dynamics model outputs predicted fatigue on the virtual component 125 based on virtual operation of the virtual vehicle 101. A "virtual component" is a virtual representation (i.e., a virtual component is a set of digital data) of the component 125 constructed according to the schematic as used in a computer-aided engineering (CAE) or computer-aided design (CAD) program, e.g., a finite element analysis (FEA) program, a computational fluid dynamics (CFD) program, a thermal model, etc. As described below, the predicted fatigue can be an amount of time or amount of use of the component 125 until a stress exceeds the yield strength of a portion of the component 125, i.e., the component 125 fails. The server 135 stores the predicted fatigue from the vehicle dynamics model and the optimized schematic for constructing components 125. The server 135 can perform the steps 220 and 225 a plurality of times in succession, e.g., adjusting dimensions of the schematic, then inputting the fatigue model of the schematic to the dynamics model, then adjusting the dimension based on the output of the dynamics model, etc.

In a sixth step 230, a manufacturer constructs the vehicle component 125 according to the optimized schematic. With the data 115 from the vehicle dynamics model, the manufacturer can construct the vehicle component 125 and compare empirical tests to the data 115 from the vehicle dynamics model to predict damage to the component 125.

FIG. 3 is a diagram of example operation parameter histograms 300, here shown as four operation parameter histograms 300a, 300b, 300c, 300d for respective test vehicles 101a, 101b, 101c, 101d. In this context, a "test vehicle" is a vehicle 101 that communicates with the server 135 to receive the operation parameter histograms 300, e.g., a consumer vehicle 101, a manufacturer-owned vehicle 101, a vehicle 101 owned by a testing company, etc. Each operation parameter histogram 300 includes an array of elements 305. Each element 305 is a set of four values: a minimum value, an average value, a maximum value, and a total number of data points in the element. The minimum value and the maximum value define a specified range of an operation parameter. As described above, an "operation parameter" is a measurable quantity of operation of a vehicle component 125. Example operation parameters include, e.g., a vehicle speed, a steering torque, a braking torque, a fuel flow rate, a transmission speed, etc. In the example of FIG. 3, the operation parameter histograms 300 including data 115 regarding steering torque on a steering differential 125 in ranges of N-m. The first element 305a of the operation parameter histogram 300a includes a number of data points below a first threshold, the first threshold defining the first maximum value for the element 305a, and the minimum value is 0. The second element 305b of the operation parameter histogram 300a is a number of points above or equal to the first threshold, defining the minimum value for the element 305b, and below a second threshold, defining the maximum value for the element 305b. The third element 305c of the operation parameter histogram 300a includes a number of points above or equal to the second threshold, defining the minimum value for the third element 305c, and below a third threshold, defining the maximum value for the third element 305c. The fourth element 305d of the operation parameter histogram 300a is a number of points above or equal to the third threshold, defining the minimum value for the element 305d, and the maximum value is the greatest detected value during data 115 collection. The first, second, and third thresholds can be determined based on empirical testing of operation parameters and specified values at which material fatigue may occur. The server 135 can determine the first, second, and third thresholds such that the amount of data 115 within each element 305 is substantially equal, e.g., about 25% of the total data 115 would be stored in each element 305a-305d. The server 135 can generate respective operation parameter histograms 300 for each of a plurality of vehicle operation parameters.

The server 135 sends the operation parameter histograms 300 to a plurality of test vehicles 101 over the network 130. Each computer 105 in each test vehicle 101 can operate the vehicle 101 to collect data 115 according to the operation parameter histograms 300. That is, as each computer 105 operates each vehicle 101, the computer 105 collects data 115 about vehicle 101 operation and modifies the operation parameter histograms 300 according to the data 115. The computer 105 can input the data 115 to the operation parameter histograms 300, generating values for each element 305 according to the thresholds for each element 305, as described above.

In addition to collecting data 115 for the operation parameter histograms 300, each computer 105 can collect additional data 115 not specified by the operation parameter histograms 300. That is, some data 115 may not require quantification into specific operation parameter histograms 300 but may still be useful for designing the component 125. For example, each computer 105 can collect data about a surrounding environment of each test vehicle 101, e.g., an urban environment, a rural environment, etc. In another example, each computer 105 can collect weather data 115 from the area surrounding the test vehicle 101, e.g., precipitation, temperature, air pressure, etc.

The server 135 can receive data 115 from each test vehicle 101 including the operation parameter histograms 300. That is, upon collecting data 115 and filling the arrays of the operation parameter histograms 300, each computer 105 can transmit the filled operation parameter histograms 300 and additional data 115 not reflected in the operation parameter histograms 300 to the server 135 over the network 130. Upon receiving the operation parameter histograms 300 and the additional data 115, the server 135 can input each operation parameter histogram 300 and the data 115 to a machine learning program that outputs classifications based on the data 115. The machine learning program can be, e.g., a neural network such as a deep neural network, a convolutional neural network, etc., that includes a cost function. The cost function can include a plurality of weighted variables that can be tuned to minimize a difference between a reference input and a generated output. The machine learning program can output classifications corresponding to values of the cost function below a predetermined cost threshold. The cost threshold can be determined as a value at which the machine learning program generates an output corresponding to a reference input correctly at a predetermined percentage, e.g., 95% of inputs are correctly identified in generated output. The machine learning program can cluster classifications according to specific characteristics. For example, the machine learning program can cluster classifications according to a type of environment, as described below, and then according to a type of vehicle use, and then according to ambient weather.

Figure 4:
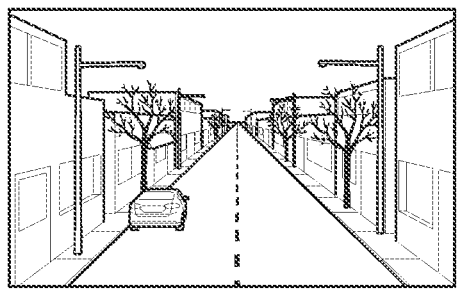
FIG. 4 is a diagram of example classifications determined based on the operation parameter histograms.
Figure 4:
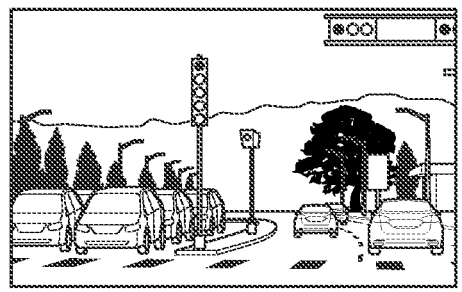
Figure 4:
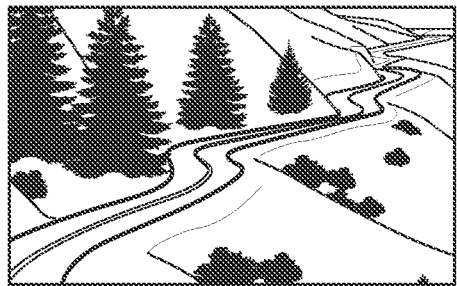
Figure 4:
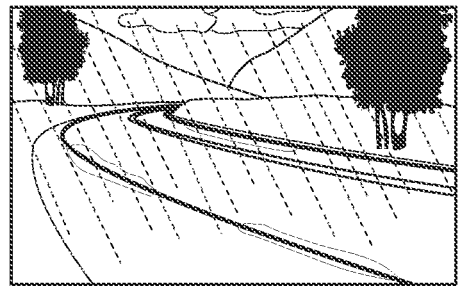
Figure 4:
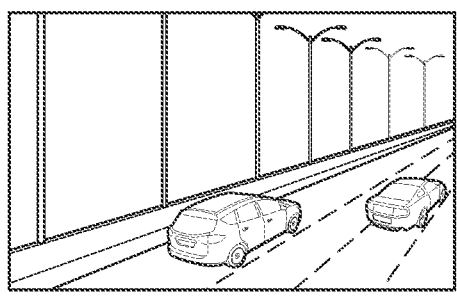
Figure 4:

FIG. 4 is a diagram of a plurality of example classifications. In this context, a "classification" is a set of characteristics about a roadway that includes a type of environment and a type of vehicle use on the roadway. Roadways associated with different classifications cause different stresses on components 125 which can require adjustments to design of the components 125 to improve life of the component 125. The example of FIG. 4 illustrates six example classifications, and the machine learning program can generate a different number of classifications.

Each classification includes representation of a specific type of environment of a roadway. A "type of environment" is a description of physical characteristics of the roadway and the surrounding area. Example types of environment can include, e.g., a rural environment, an urban environment, a highway environment, etc. That is, each type of environment describes characteristics about the environment around the roadway that can affect operation of the component 125.

Each classification includes representation of a specific type of use of the test vehicle 101. A "type of test vehicle use" is a description of objects, markings, and/or scenarios that affect operation of the test vehicle 101. Example types of test vehicle use can include, e.g., a specified speed limit, a stop light, a traffic intersection, a curved path, a straight path, etc. That is, the type of test vehicle use specifies how test vehicles 101 operate that can affect operation of the components 125. For example, if the type of test vehicle use is a stop light, data 115 associated with the type of test vehicle use would include braking the test vehicle 101 to a stop and accelerating the test vehicle 101 from the stop, which involves operation of components 125 of subsystems 120 such as the propulsion, the brake, etc. Stopping at the stop light can increase wear on components 125 associated with braking, and the server 135 can use data 115 assigned to classifications associated with stop lights to adjust design of components 125 associated with the braking subsystem 120. In another example, the type of test vehicle use can change based on the characteristics of the roadway, e.g., on a straight path, fewer components associated with steering may be actuated than on a curved path.

The classifications can include a representation of ambient weather. As described above, each computer 105 in each test vehicle 101 can collect weather data 115 of the area surrounding the test vehicle 101. For example, each computer 105 can actuate a precipitation sensor and an ambient temperature sensor to collect the weather data 115. In another example, each computer 105 can collect weather data 115 from an external server 135, e.g., from a weather station. The server 135 can input the weather data 115 into the machine learning program to output classifications associated with different types of weather. For example, the classification can include dry weather, rain, snow, etc.

The classifications shown in FIG. 4 describe both a type of environment and a type of vehicle use. The machine learning program can output a classification for each operation parameter histogram. In the example of FIG. 4, the machine learning program identifies six classifications, abbreviated as "Class" A-F. Classification A is an urban, dry, straight-path classification, i.e., the environment is an urban environment, the weather is dry, and the type of vehicle use is straight-path. Classification B is an urban, dry, traffic classification, i.e., the environment is an urban environment, the weather is dry, and the type of vehicle use is urban traffic. Classification C is a rural, dry, curved path classification, i.e., the environment is an urban environment, the weather is dry, and the type of vehicle use is a curved path. Classification D is a rural, raining, curved path classification. Classification E is a highway environment, dry, straight path classification. Classification F is a rural, snowing, curved path classification.

Figure 5:
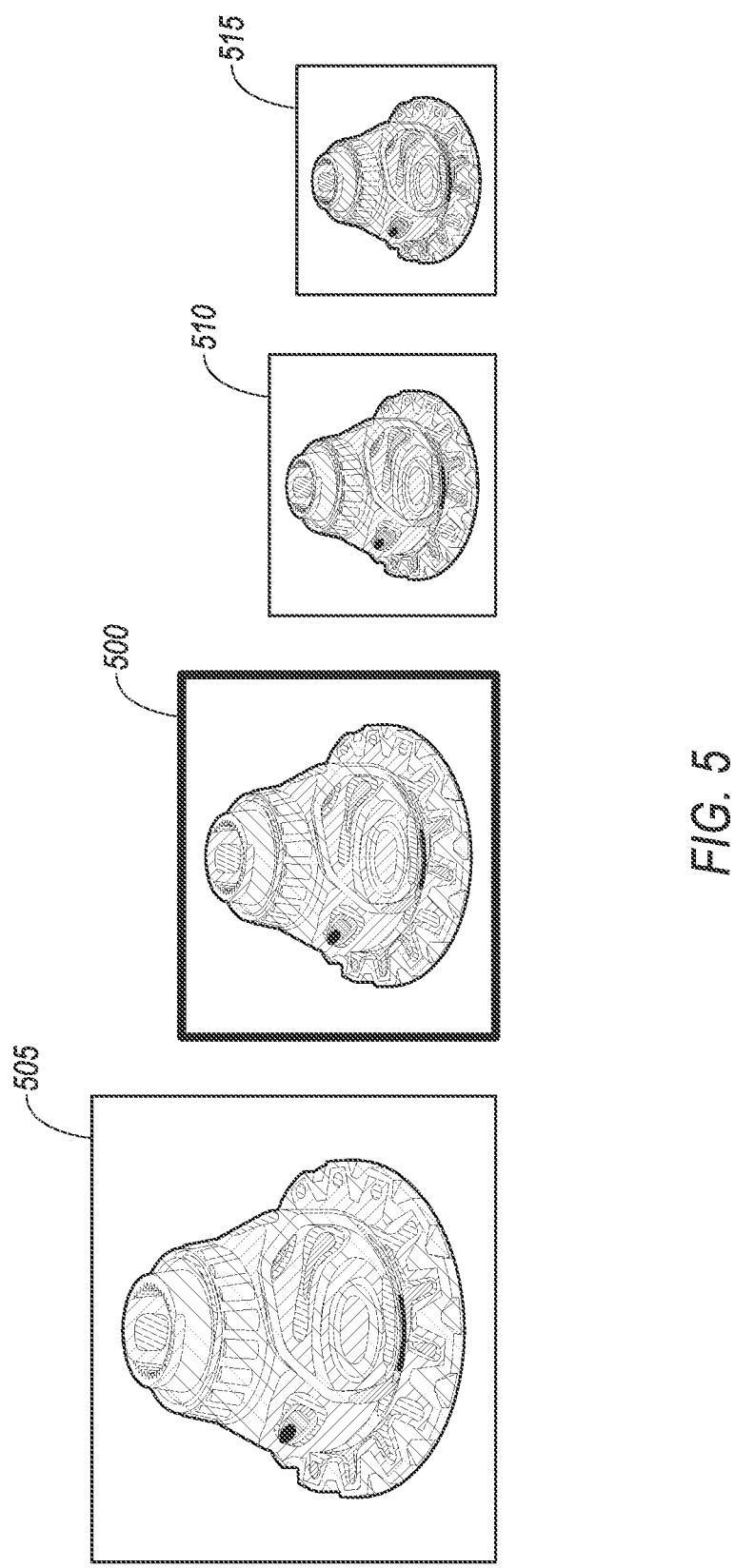
FIG. 5 is a perspective view of example schematics of the vehicle component.

FIG. 5 illustrates example three-dimensional schematics 500, 505, 510, 515 of a component 125. A "schematic" is a three-dimensional drawing that describes the measurements of the component 125, e.g., length, width, height, thickness, contours, etc. The schematic 500 can be an engineering drawing such as a computer-aided design (CAD) drawing and/or a computer-aided engineering (CAE) model. In the example of FIG. 5, the component 125 is a steering differential that transmits torque from a powertrain to a wheel. That is, the component 125 should be optimized to reduce an amount of material to manufacture the component 125 while maintaining material strength to transmit torque over a predetermined time period, e.g., a time specified by a manufacturer warranty, e.g., five years, and/or a predetermined usage, e.g., 60,000 miles. The server 135 can generate a first schematic 500 according to a predetermined set of dimensions for the component 125 and can adjust the size and/or shape of the first schematic 500 to another schematic 505, 510, 515.

The server 135 inputs the classifications and the operation parameter histograms and the schematic 500 to a predictive damage model. The "predictive damage model" is a simulation of stresses on a virtual component 125 represented by the schematic, e.g., mechanical stresses, thermal stresses, stresses over time, stresses from movement of portions of the component 125, etc. The predictive damage model can be a CAE model that receives the operation parameter histograms and the classifications as input and generates data 115 indicating stresses on the virtual component 125 as output. That is, the predictive damage model can be an equation or a set of equations that simulates stresses on the virtual component 125 from inputs such as simulated torque. For example, the output of the predictive damage model can include a "fatigue limit," i.e., an amount of motion specifying stresses on the virtual component that generate strains exceeding a material yield strength. For example, the fatigue limit of a rotating component 125 as shown in the example of FIG. 5 can be a number of revolutions until stresses reach the yield strength at a specified torque. That is, the specified torque can rotate the virtual component 125 and generate stresses. When the stresses induce strains that reach or exceed the yield strength, the predictive damage model can output the number of revolutions at which the yield strength was reached as the fatigue limit.

The server 135 can adjust one or more dimensions of the schematic 500 based on the predictive damage model. As described above, the schematic describes the size, shape, and material composition of the virtual component 125. The server 135 can, based on the output from the predictive damage model, adjust the schematic 500 to adjust output from the predictive damage model. The server 135 can adjust a size, a shape, and/or a material thickness of the schematic 500 based on the output of the predictive damage model. For example, the server 135 can reduce a size of a portion of the schematic 500 to generate a new schematic 510, 515 to reduce an amount of material required to construct the component 125 and input the adjusted schematic 510, 515 to the predictive damage model to generate a fatigue limit for the adjusted schematic 510, 515. In another example, the server 135 can increase a size of the schematic 500 to an adjusted schematic 505 to reduce strains caused by stresses on the virtual component 125.

The server 135 can adjust the schematic 500 until one or more optimization criteria are met. In this context, an "optimization criterion" is a measurable quantity of the virtual component 125 that changes when the server adjusts the schematic 500. Example optimization criteria include, e.g., size, cost, weight, fatigue limit, etc. For example, the server 135 can reduce the size of the schematic and input the adjusted schematic 500 to the predictive damage model until a weight optimization criterion and a fatigue limit optimization criterion are met. That is, as the server 135 reduces the size of the schematic 500, the weight of a vehicle component 125 constructed according to the schematic 500 decreases, and the fatigue limit of the vehicle component 125 decreases. The server 135 can input the classifications and successive adjusted three-dimensional schematics 505, 510, 515 to successive predictive damage models until one or more optimization criteria is satisfied. The server 135 can adjust the size of the schematic 500 to reduce the weight of the virtual component 125 while maintain the fatigue limit specified by the optimization criteria. Alternatively or additionally, the server 135 can adjust a shape and/or a material composition of the schematic 500 to meet the optimization criteria. For example, the server 135 can identify a portion of the schematic where a stress exceeds a first stress threshold and can increase a material thickness of the portion to decrease the stress to below the first stress threshold. The server 135 can identify a second portion of the schematic where a stress is below a second stress threshold and can decrease a material thickness of the second portion to reduce a weight of the second portion. The stress threshold can be, e.g., a yield strength of the material multiplied by a predetermined safety factor, e.g., 0.8. The second stress threshold can be the yield strength of the material multiplied by a minimum stress multiplier, e.g., 0.2. In the example of FIG. 5, the schematic 500, in bold outline, meets the optimization criteria.

Upon meeting the optimization criteria, the server 135 can input performance data 115 (e.g., torque) from a vehicle dynamics model to the predictive damage model for the adjusted schematic. The "vehicle dynamics model" is a kinematic model describing vehicle 101 motion that outputs performance data 115 to the predictive damage model for a virtual component 125 constructed according to the adjusted schematic 500. The vehicle dynamics model includes a model of a plurality of virtual road segments, each road segment representing one or more road conditions associated with one of the classifications, described above. For example, one of the road segments can include road conditions associated with an urban, dry, traffic classification, and a successive road segment can include road conditions associated with an urban, raining, curved path classification. Each road segment includes a specified curvature, slope, and banking, as well as traffic signs, traffic lights, and road markings. By inputting the virtual vehicle 101 with the adjusted schematic to the vehicle dynamics model, the server 135 can collect data 115 about performance of the virtual component 125 represented by the adjusted schematic on road segments corresponding to the classifications. That is, the server 135 can test the virtual component 125 in a plurality of different environments and vehicle use scenarios supplemental to the operation parameter histograms 300 and the predictive damage model.

Figure 6:
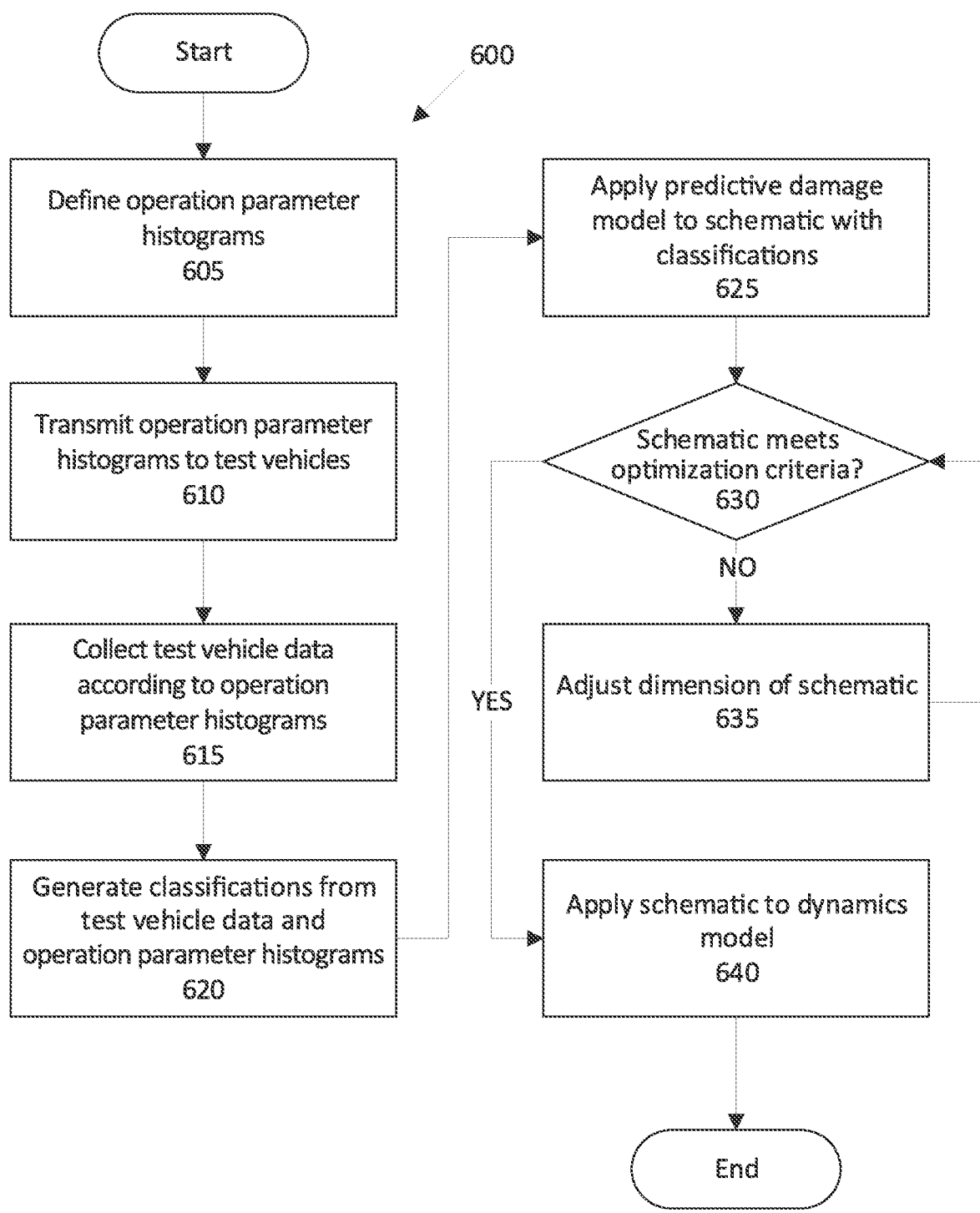
FIG. 6 is a block diagram of an example process for designing a vehicle component.

FIG. 6 is a block diagram of an example process 600 for dimensioning a component 125. The process 600 begins in a block 605, in which a server 135 defines a plurality of operation parameter histograms 300 for a plurality of test vehicles 101. As described above, the operation parameter histograms 300 are arrays that store data 115 collected by sensors 110 of the test vehicles 101 according to predetermined thresholds.

Next, in a block 610, the server 135 transmits the operation parameter histograms 300 to the test vehicles 101. The server 135 can transmit the operation parameter histograms 300 to the test vehicles 101 over the network 130. Each computer 105 of each test vehicle 101 can receive the operation parameter histograms 300 and actuate one or more sensors 110 to collect data 115 specified by the operation parameter histograms 300.

Next, in a block 615, the server 135 collects data 115 and the operation parameter histograms 300 from the test vehicles 101. That is, each test vehicle 101 transmits the operation parameter histograms 300 with data 115 corresponding to the elements of the operation parameter histograms 300. Each test vehicle 101 transmits additional data 115 not reflected in the operation parameter histograms 300, e.g., environmental data 115, test vehicle 101 use data 115, weather data 115, etc.

Next, in a block 620, the server 135 generates a plurality of classifications based on the data 115 and the operation parameter histograms 300 from the test vehicles 101. As described above, the server 135 can input the data 115 and the operation parameter histograms 300 to a machine learning program that outputs a plurality of classifications. As described above, the machine learning program can include a cost function with a plurality of weighted variables and the machine learning program can output classifications corresponding to values of the cost function below a predetermined threshold. Each classification includes a representation of a type of environment and a type of vehicle use. For example, a classification can describe an urban environment in traffic.

Next, in a block 625, the server 135 applies a predictive damage model to a schematic of the component 125 and the classifications. As described above, the predictive damage model simulates stresses on the schematic representing a virtual component 125, the stresses caused by vehicle 101 operation described by the classifications. For example, the predictive damage model can simulate stresses based on a yield strength of the material of the virtual component 125.

Next, in a block 630, the server 135 determines whether the schematic meets one or more optimization criteria. The optimization criteria are measurable quantities of parameters of the virtual component 125 that change when the server 135 adjusts the schematic. The optimization criteria can include, e.g., cost, weight, deformation strength, etc. The server 135 can determine whether the schematic meets optimization criteria specified by, e.g., a manufacturer. If the server 135 determines that the schematic meets the optimization criteria, the process 600 continues in a block 635. Otherwise, the process 600 continues in a block 640.

In the block 635, the server 135 adjusts one or more dimensions of the schematic. As described above, the server 135 can adjust a size and/or a shape of the schematic to meet the optimization criteria. For example, the server 135 can reduce a size of the schematic to meet an optimization criterion specifying a weight of the component 125. The process 600 returns to the block 630.

In the block 640, the server 135 inputs the adjusted schematic to a vehicle dynamics model. The vehicle dynamics model simulates operation of a virtual vehicle 101 with a virtual component 125 according to the adjusted schematic. The server 135 collects data 115 from the vehicle dynamics model to validate the optimization criteria and to test operation of the virtual component 125 not considered with the predictive damage model. Following the block 640, the process 600 ends.

As used herein, the adverb "substantially" modifying an adjective means that a shape, structure, measurement, value, calculation, etc. may deviate from an exact described geometry, distance, measurement, value, calculation, etc., because of imperfections in materials, machining, manufacturing, data collector measurements, computations, processing time, communications time, etc.

Computing devices discussed herein, including the computer 105 and server 135, include processors and memories, the memories generally each including instructions executable by one or more computing devices such as those identified above, and for carrying out blocks or steps of processes described above. Computer executable instructions may be compiled or interpreted from computer programs created using a variety of programming languages and/or technologies, including, without limitation, and either alone or in combination, Java™, C, C++, Visual Basic, Java Script, Python, Perl, HTML, etc. In general, a processor (e.g., a microprocessor) receives instructions, e.g., from a memory, a computer readable medium, etc., and executes these instructions, thereby performing one or more processes, including one or more of the processes described herein. Such instructions and other data may be stored and transmitted using a variety of computer readable media. A file in the computer 105 is generally a collection of data stored on a computer readable medium, such as a storage medium, a random access memory, etc.

A computer readable medium includes any medium that participates in providing data (e.g., instructions), which may be read by a computer. Such a medium may take many forms, including, but not limited to, non volatile media, volatile media, etc. Non volatile media include, for example, optical or magnetic disks and other persistent memory. Volatile media include dynamic random access memory (DRAM), which typically constitutes a main memory. Common forms of computer readable media include, for example, a floppy disk, a flexible disk, hard disk, magnetic tape, any other magnetic medium, a CD ROM, DVD, any other optical medium, punch cards, paper tape, any other physical medium with patterns of holes, a RAM, a PROM, an EPROM, a FLASH EEPROM, any other memory chip or cartridge, or any other medium from which a computer can read.

With regard to the media, processes, systems, methods, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. For example, in the process 600, one or more of the steps could be omitted, or the steps could be executed in a different order than shown in FIG. 6. In other words, the descriptions of systems and/or processes herein are provided for the purpose of illustrating certain embodiments, and should in no way be construed so as to limit the disclosed subject matter.

Accordingly, it is to be understood that the present disclosure, including the above description and the accompanying figures and below claims, is intended to be illustrative and not restrictive. Many embodiments and applications other than the examples provided would be apparent to those of skill in the art upon reading the above description. The scope of the invention should be determined, not with reference to the above description, but should instead be determined with reference to claims appended hereto and/or included in a non provisional patent application based hereon, along with the full scope of equivalents to which such claims are entitled. It is anticipated and intended that future developments will occur in the arts discussed herein, and that the disclosed systems and methods will be incorporated into such future embodiments. In sum, it should be understood that the disclosed subject matter is capable of modification and variation.

The article "a" modifying a noun should be understood as meaning one or more unless stated otherwise, or context requires otherwise. The phrase "based on" encompasses being partly or entirely based on.

What is claimed is:

1. A system, comprising a computer including a processor and a memory, the memory storing instructions executable by the processor to:

generate an operation parameter histogram for each of a plurality of vehicle operation parameters based on collected data about operation of a plurality of vehicles, each operation parameter histogram including an array of elements, each element being a number of data points for one of the operation parameters that are within a specified range;

operate a test vehicle according to the operation parameter histograms;

input each operation parameter histogram and a plurality of test vehicle environment data to a machine learning program;

output from the machine learning program a classification for each operation parameter histogram from the machine learning program, each classification representing a type of environment and a type of test vehicle use;

input the classifications to a predictive damage model of a three-dimensional schematic of a vehicle component; and adjust one of a size or a shape of the three-dimensional schematic based the output of the predictive damage model.

2. The system of claim 1, wherein the instructions further include instructions to, upon adjusting one of the size or the shape of the three-dimensional schematic, input the classifications to a predictive damage model of the adjusted three-dimensional schematic and adjust one of a size or a shape of the adjusted three-dimensional schematic based on the output of the predictive damage model.

3. The system of claim 2, wherein the instructions further include instructions to input the classifications and successive adjusted three-dimensional schematics to successive predictive damage models until an optimization criterion for at least one of the size or the shape of the three-dimensional schematic is satisfied.

4. The system of claim 1, wherein the instructions further include instructions to adjust a material thickness of the three-dimensional schematic based on the output of the predictive damage model.

5. The system of claim 1, wherein the output of the predictive damage model includes a fatigue limit specifying a stress on a virtual component modeled according to the three-dimensional schematic that generates a strain exceeding a material yield strength.

6. The system of claim 5, wherein the fatigue limit is a number of revolutions of the virtual component rotating at a specified torque.

7. The system of claim 1, wherein the instructions further include instructions to input performance data from a vehicle dynamics model to a predictive damage model for a virtual component constructed according to the three-dimensional schematic.

8. The system of claim 7, wherein the vehicle dynamics model includes a model of a plurality of road segments and the performance data for the virtual component includes performance data for each road segment.

9. The system of claim 7, wherein the vehicle dynamics model includes a model of a plurality of road conditions, and the performance data includes data of the virtual component operating in the plurality of road conditions.

10. The system of claim 9, wherein each road condition is associated with one of the classifications.

11. The system of claim 1, wherein the type of test vehicle use includes at least one of a specified speed limit, a stop light, or a traffic intersection.

12. The system of claim 1, wherein the operation parameters include at least one of a vehicle speed, a steering torque, a braking torque, a fuel flow rate, or a transmission speed.

13. The system of claim 1, wherein the instructions further include instructions to adjust the size of the three-dimensional schematic to reduce a weight of a vehicle component constructed according to the three-dimensional schematic.

14. The system of claim 1, wherein the type of environment includes at least one of a rural environment, an urban environment, and a highway environment.

15. A method, comprising:
generating an operation parameter histogram for each of a plurality of vehicle operation parameters based on collected data about operation of a plurality of vehicles, each operation parameter histogram including an array of elements, each element being a number of data points for one of the operation parameters that are within a specified range;
operating a test vehicle according to the operation parameter histograms;
inputting each operation parameter histogram and a plurality of test vehicle environment data to a machine learning program;
outputting from the machine learning program a classification for each operation parameter histogram from the machine learning program, each classification representing a type of environment and a type of test vehicle use;
inputting the classifications to a predictive damage model of a three-dimensional schematic of a vehicle component; and
adjusting one of a size or a shape of the three-dimensional schematic based the output of the predictive damage model.

16. The method of claim 15, further comprising, upon adjusting one of the size or the shape of the three-dimensional schematic, inputting the classifications to a predictive damage model of the adjusted three-dimensional schematic and adjusting one of a size or a shape of the adjusted three-dimensional schematic based on the output of the predictive damage model.

17. The method of claim 15, further comprising inputting performance data from a vehicle dynamics model to a predictive damage model for a virtual component constructed according to the three-dimensional schematic.

18. A system, comprising:
a test vehicle including a plurality of vehicle sensors;
means for generating an operation parameter histogram for each of a plurality of vehicle operation parameters based on collected data about operation of a plurality of vehicles, each operation parameter histogram including an array of elements, each element being a number of data points for one of the operation parameters that are within a specified range;
means for operating a test vehicle according to the operation parameter histograms;
means for inputting each operation parameter histogram and a plurality of test vehicle environment data to a machine learning program;
means for outputting from the machine learning program a classification for each operation parameter histogram from the machine learning program, each classification representing a type of environment and a type of test vehicle use;
means for inputting the classifications to a predictive damage model of a three-dimensional schematic of a vehicle component; and
means for adjusting one of a size or a shape of the three-dimensional schematic based on the output of the predictive damage model.

19. The system of claim 18, further comprising means for inputting the classifications to a predictive damage model of the adjusted three-dimensional schematic and adjusting one of a size or a shape of the adjusted three-dimensional schematic based on the output of the predictive damage model upon adjusting one of the size or the shape of the three-dimensional schematic.

20. The system of claim 18, further comprising means for inputting performance data from a vehicle dynamics model to a predictive damage model for a virtual component constructed according to the three-dimensional schematic.

* * * * *

UNITED STATES PATENT AND TRADEMARK OFFICE
CERTIFICATE OF CORRECTION

PATENT NO. : 11,449,651 B2
APPLICATION NO. : 16/674645
DATED : September 20, 2022
INVENTOR(S) : David Ostrowski et al.

It is certified that error appears in the above-identified patent and that said Letters Patent is hereby corrected as shown below:

On the Title Page

Abstract (57), Line 13: insert --on-- before "the" (first occurrence).

Signed and Sealed this
Fifteenth Day of November, 2022

Katherine Kelly Vidal
*Director of the United States Patent and Trademark Office*